US006781220B2

United States Patent
Täube et al.

(10) Patent No.: US 6,781,220 B2
(45) Date of Patent: Aug. 24, 2004

(54) PRINTED CIRCUIT BOARD FOR SEMICONDUCTOR MEMORY DEVICE

(75) Inventors: Andreas Täube, Unterschleissheim (DE); Jean-Marc Dortu, Munich (DE); Paul Schmölz, Munich (DE); Robert Feurle, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/160,446

(22) Filed: May 30, 2002

(65) Prior Publication Data

US 2003/0030995 A1 Feb. 13, 2003

(30) Foreign Application Priority Data

May 30, 2001 (DE) .......................................... 101 26 310

(51) Int. Cl.[7] .............................................. H01L 23/495
(52) U.S. Cl. ....................... 257/668; 257/680; 257/779; 257/780; 257/737
(58) Field of Search ................................ 257/668, 680, 257/779–780, 737

(56) References Cited

U.S. PATENT DOCUMENTS

| 6,252,298 B1 | * | 6/2001 | Lee et al. .................... 257/668 |
| 6,462,423 B1 | * | 10/2002 | Akram et al. ................ 257/778 |
| 6,577,004 B1 | * | 6/2003 | Rumsey et al. ............. 257/738 |

FOREIGN PATENT DOCUMENTS

| EP | 0 520 841 | 12/1992 | .......... H01L/21/66 |
| EP | 0 533 589 | 3/1993 | ......... H01L/23/495 |

\* cited by examiner

*Primary Examiner*—Luan Thai
(74) *Attorney, Agent, or Firm*—Fish & Richardson P.C.

(57) ABSTRACT

In a semiconductor memory device, a printed circuit board connects a memory chip to an external circuit. The printed circuit board includes a multiplicity of pads arranged in a column. These pads connect the board to the memory chip. The board also includes a multiplicity of data terminals arranged in at least two columns and connected to the pads by data connections. The data connections are configured such that each data connection has essentially the same electrical properties as any other data connection.

28 Claims, 3 Drawing Sheets

PRINTED CIRCUIT BOARD FOR SEMICONDUCTOR MEMORY DEVICE

FIELD OF INVENTION

The invention relates to semiconductor memory devices, and in particular, to connection between a memory chip and an external circuit.

RELATED APPLICATIONS

This application claims the benefit of the May 30, 2001 filing date of German application 101 26 310.4-34, the contents of which are herein incorporated by reference.

BACKGROUND

It is known to provide semiconductor memory devices which comprise a memory chip and a printed circuit board device for connecting the memory chip to an external circuit. The memory chip has an integrated circuit formed with the aid of a lithography method. In order to be able to address the memory chip, memory chip pads or bond in a pads are provided on the memory chip. The printed circuit board device is provided in order to be able to connect the memory chip to an external circuit. The printed circuit board device comprises printed circuit board pads or lead fingers for connecting the printed circuit board device to the memory chip by means of a bonding wire, which is generally formed as a fine gold wire. At the two longitudinal sides of the printed circuit board device, a multiplicity of contacts are provided in order to contact-connect and connect the printed circuit board device to the external circuit. Since the memory chip has a much smaller size than the printed circuit board device and thus the entire semiconductor memory device, the ratio of memory chip size to semiconductor memory device size is relatively small. For many applications, the size of the semiconductor memory device is of great importance; in particular, it is desirable to maximize the ratio of memory chip size to semiconductor memory device size. Furthermore, if such a memory is operated with high clock rates (e.g. 300 MHz), problems can arise during the data transmission on account of the high clock rate.

SUMMARY

Consequently, the object of the present invention is to provide a printed circuit board device, the use thereof and a semiconductor memory device which have a better ratio of memory chip size to semiconductor memory device size and a which enable a reliable operation of a memory chip in particular at high clock rates.

The invention provides a printed circuit board device (so-called interposer) for a semiconductor memory device for connecting a memory chip to an external circuit, the printed circuit board device comprising:

a multiplicity of printed circuit board pads (so-called lead fingers) for connecting the printed circuit board device to the memory chip, the printed circuit board pads being arranged in at least one column-type arrangement, a multiplicity of data terminals (so-called DQ and DQS pins) for inputting and outputting data, the data terminals being arranged in at least two column-type arrangements, which preferably run essentially parallel to the arrangement of the printed circuit board pads, data connections for connecting the data terminals and the printed circuit board pads, wherein the data connections of the at least two data terminals, which are arranged in the at least two column-type arrangements in a manner provided in different columns, to the respective printed circuit board pads are configured in such a way that their electrical properties and/or the temporal offset (so-called time skew or DQ/DQ skew or DQS/DQS skew) of the respective data signals are essentially identical.

The fact that the data connections to the at least two data terminals have essentially the same electrical properties and/or the same temporal offset makes it possible to ensure that the applied data signals are present essentially simultaneously at the respective data inputs of the memory chip. Consequently, a reliable data transmission can be ensured in particular at high clock rates.

Preferably, the data connections to all the data terminals are configured in such a way that their electrical properties and/or the temporal offset of the respective data signals are essentially identical.

By furthermore providing for all the data connections to have the same electrical properties and/or the same temporal offset it is possible to achieve an even more advantageous operation of the memory chip.

In a preferred embodiment, the data connections are configured in such a way that their physical lengths are essentially identical. The data connections are furthermore preferably configured in such a way that their cross sections are essentially identical.

The provision of data connections having the same length and the same cross section makes it possible to achieve an essentially identical capacitance and inductance of the data connections, which has the result that the data signals are in each case all present simultaneously at the memory chip.

Preferably, the printed circuit board pads are arranged in a central region, most preferably in the longitudinal direction, of the printed circuit board device.

In a preferred embodiment, the printed circuit board device according the invention furthermore comprises addressing terminals (so-called address pins) for inputting address information and addressing connections for connecting the addressing terminals and the printed circuit board pads, command terminals (so-called command pins) for inputting commands and command connections for connecting the command terminals under printed circuit board pads, and/or supply terminals (so-called VDD, VSS, VDDQ and VSSQ pins) for the connection of supply voltages and supply connections for connecting the supply terminals and the printed circuit board pads, wherein in each case a printed circuit board pad is assigned to each data terminal and to each addressing terminal and to each command terminal and at least one printed circuit board pad is assigned to each supply terminal.

The data terminals, the addressing terminals, the command terminals and the supply terminals are further preferably arranged in a grid pattern.

In a preferred embodiment, a plurality of data terminals are arranged in a manner grouped in at least one group in the grid pattern.

Preferably, the data terminals comprise receiver Strobe terminals (so-called DQS pins), which is arranged centrally in the column direction in the group of data terminals.

It has proved to be advantageous to group the data terminals and to order the receiver Strobe terminals centrally in the groups. Clock signals rather than data are transmitted via the receiver Strobe terminals. However, on account of the similarity between the signal waveform of the clock signals and the signal waveform of the data signals, the receiver Strobe terminals are treated as data terminals. This arrangement improves the signal transmission of the individual DQ terminals. Furthermore, the time skew, i.e. the temporal offset of the signals, [lacuna] be reduced.

Preferably, the supply terminals comprise data supply terminals (so-called VDDQ and VSSQ pins), which are arranged in the grid pattern between the data terminals and the printed circuit board pads. Furthermore, at least two printed circuit board pads are assigned to each data supply terminal.

The data processing in the memory chip requires a high current. The latter can be provided by the advantageous arrangement of the data supply terminals, in particular by the arrangement via at least two printed circuit board pads.

Preferably, the supply terminals comprise grounding terminals (so-called VSS pins), which are arranged in the grid pattern in an outer region, preferably in the outermost column-type arrangement.

The grounding terminals are further preferably arranged in the vicinity of the data terminals. The connections of the grounding terminals preferably in each case run between two "rows" of the data terminals arranged in a column-like manner, whereby advantageous shielding of the data terminals can be achieved.

In a preferred embodiment, on the printed circuit board device, at positions corresponding to the data terminals, the addressing terminals, the command terminals and the supply terminals, fixing facilities, preferably small tin balls (so-called BGA balls), are furthermore provided for connecting the printed circuit board device to the circuit. In particular, it is preferred for the printed circuit board device to be formed as a ball grid array (BGA).

The present invention furthermore provides a printed circuit board device for a semiconductor memory device for connecting a memory chip to an external circuit, in particular a printed circuit board device as described above, comprising:

a multiplicity of printed circuit board pads for connecting the printed circuit board device to the memory chip, the printed circuit board pads being arranged in at least one column-type arrangement, a multiplicity of data supply terminals for the connection of supply voltages for data transmission, which are arranged in an essentially column-type arrangement which preferably runs essentially parallel to the arrangement of the printed circuit board pads, data supply connections for connecting the data supply terminals and the printed circuit board pads, wherein at least two printed circuit board pads are assigned to each data supply terminal.

Preferably, the printed circuit board pads and the data supply terminals are directly opposite one another.

A very high current flows via the data supply connections. For this reason, it has proved to be advantageous to arrange the data supply terminals in the vicinity of the printed circuit board pads and to connect each data supply terminal to at least two printed circuit board pads via short and relatively wide data supply connections.

The invention furthermore provides a semiconductor memory device, comprising:

a printed circuit board device according to the invention, a memory chip having a multiplicity of memory chip pads (so-called bonding pads) for connecting the memory chip to the printed circuit board device, wherein the printed circuit board pads and the memory chip pads can be connected by means of a connecting facility (so-called bonding wire), which is preferably formed as a gold wire.

In a preferred embodiment, the memory chip pads are arranged in at least one column, preferably centrally in the longitudinal direction of the printed circuit board device. Preferably, the memory chip pads and printed circuit board pads that are to be connected to one another are opposite one another.

The advantageous arrangement of the memory chip pads and printed circuit board pads enables the connection between the memory chip pads and printed circuit board pads to be kept short. Consequently, it is possible to reduce negative influences of the connections between the memory chip pads and printed circuit board pads.

In a preferred embodiment, the printed circuit board device and the memory chip have essentially the same size (so-called chip size package)- Consequently, it is possible, to maximize the ratio between the size of the memory chip and the size of the semiconductor memory device.

In a preferred embodiment, the semiconductor memory device is designed as a DRAM.

Furthermore, the invention provides the use of the printed circuit board device according to the invention in a chip size package.

Further objects, features and advantages of the present invention will become apparent from the exemplary description of a preferred embodiment with reference to the drawings, in which

BRIEF PRESCRIPTION OF THE DRAWINGS

FIG. 1 shows a sectional view of a semiconductor memory device 10 according to the present invention.

DETAILED DESCRIPTION

Figure 1:
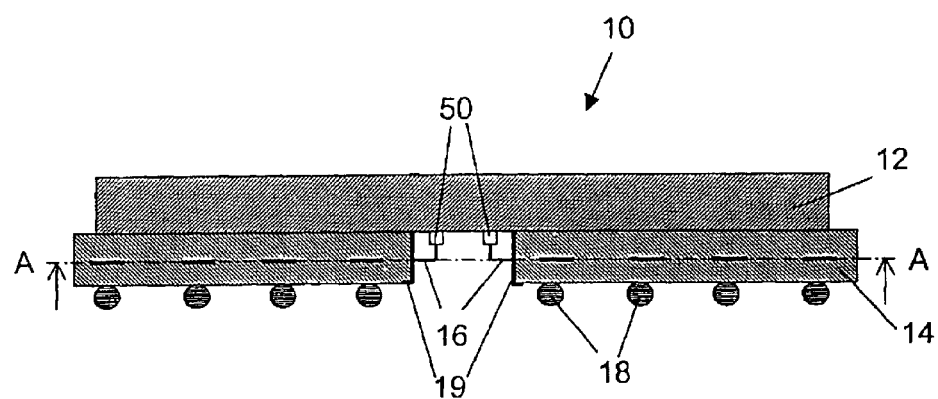
FIG. 1 shows of a semiconductor memory device according to the present invention.

The semiconductor memory device 10 comprises a memory chip 12, a printed circuit board device or interposer 14, a multiplicity of connecting facilities or bonding wires 16, which are formed as fine gold wires, for electrically connecting the memory chip 12 to the printed circuit board device 14, and a multiplicity of contact-making facilities or BGA balls 18, which are provided for contact-connecting and fixing the semiconductor memory device to an external circuit (not shown). In order to connect the memory chip 12 to the printed circuit board device 14, memory chip pads or bonding pads 50 are provided on the memory chip 12 and printed circuit board pads or lead fingers 19 are provided on the printed circuit board device 14, which can be connected to one another by means of the connecting facilities 16.

Figure 2:
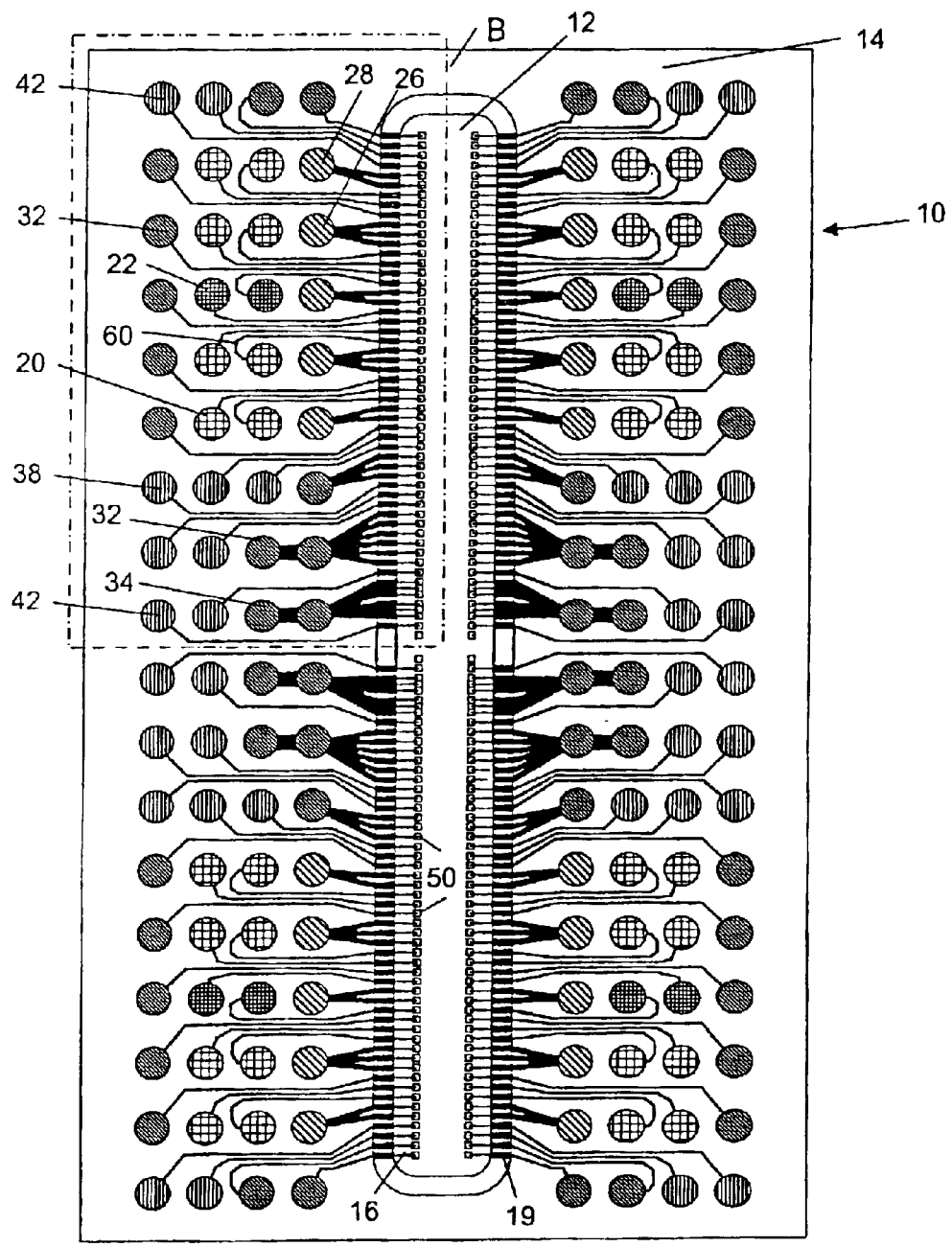
FIG. 2 shows a sectional view of a semiconductor memory device according to the present invention along line A—A of FIG. 1.
Figure 3:
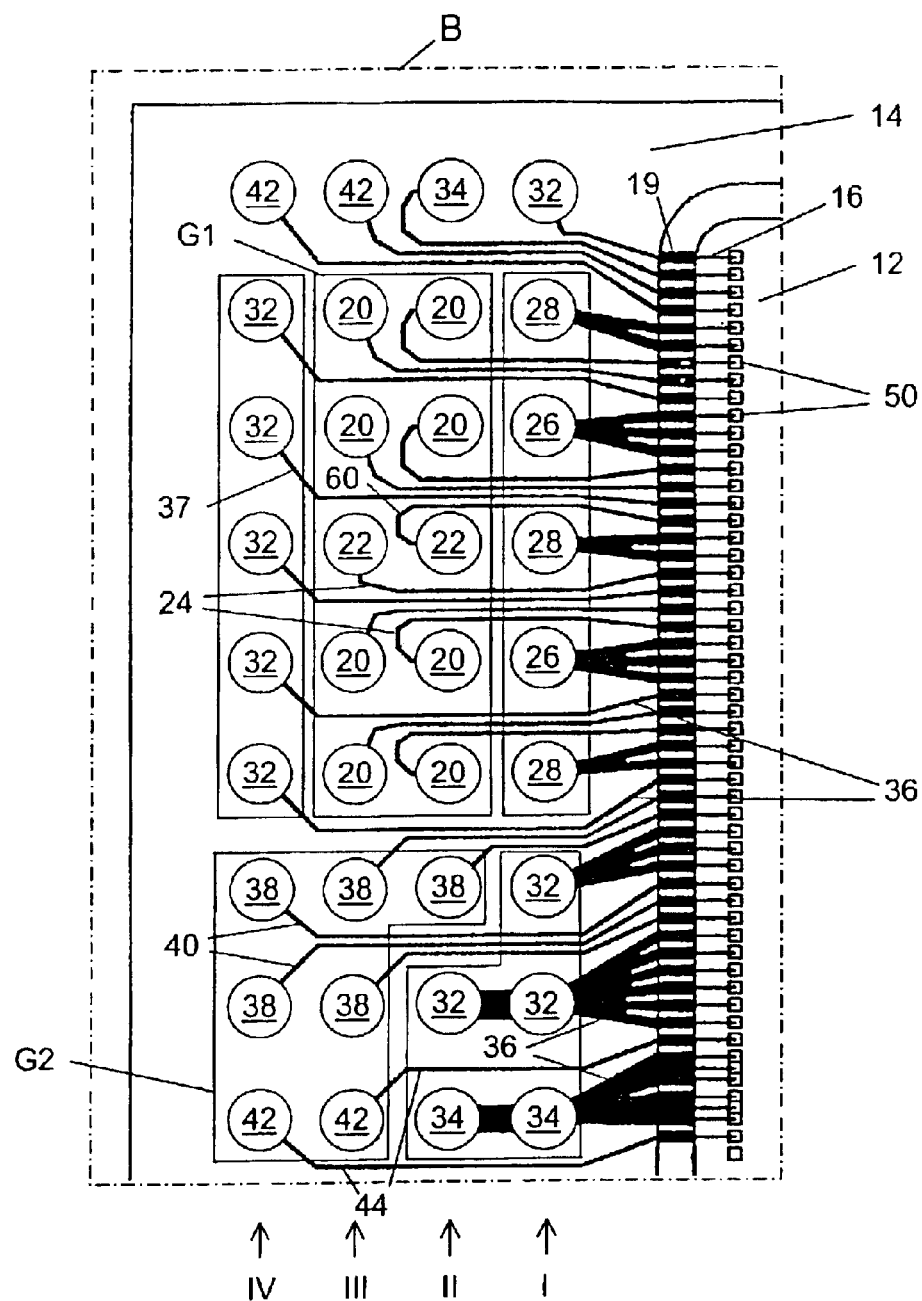
FIG. 3 shows an enlarged view of the region B of FIG. 2.

FIG. 2 shows a sectional view along the line A—A of the semiconductor memory device shown in FIG. 1. FIG. 3 furthermore shows an enlarged view of the region B of FIG. 2.

A preferred embodiment of the semiconductor memory device 10 according to the invention comprises a mirror-symmetrical arrangement of four arrangements identified by the region B. For this reason, the description below is directed at the region shown in FIG. 3. In FIG. 2, the terminals described below are illustrated only diagrammatically, identical hatching being intended to indicate identical types of terminals.

As can be seen in FIG. 3, the printed circuit board device 14 is provided with a multiplicity of terminals which are arranged in a matrix-like manner or in grid form. In the present preferred embodiment, the region B comprises four essentially mutually parallel column-type arrangements or columns of in each case a plurality of terminals, which are identified by the reference symbols I to IV from the inside toward the outside. The printed circuit board pads 19 are likewise arranged in a column-type arrangement in the longitudinal direction of the printed circuit board device 14. As can furthermore be seen in FIG. 3, the columns I–IV of the matrix-type arrangement of the terminals are arranged essentially parallel to the arrangement of the printed circuit board pads 19.

The printed circuit board device 14 according to the invention comprises DQ terminals 20 for inputting and outputting data to and from the memory chip 12. The DQ terminals 20 are preferably arranged in two adjacent column-type arrangements or columns in a manner grouped in at least one group G1. In the printed circuit board device 14 shown in FIG. 3, the DQ terminals 20 are arranged in the columns II and III in a group G1, Furthermore, the printed circuit board device 14 comprises receiver Strobe terminals DQS and DQS\22 for driving the DQ terminals with a clock signal. The receiver Strobe terminals DQS and DQS\22 are preferably provided centrally in the longitudinal direction in the group G1. Since the signals transmitted via the DQS terminals 22 have a similar signal waveform to the signals transmitted via the DQ terminals 20, the DQ terminals 20 and the DQS terminals 22 are treated the same below and therefore called data terminals 20, 22.

The data terminals 20, 22 are connected to corresponding printed circuit board pads or lead fingers 19 via DQ lines or data connections 24. According to the invention, the electrical properties, preferably the inductance and the capacitance, over the data connections 24 of two data terminals which are arranged in two different column-type arrangements are identical. In other words, the electrical properties of two data terminals 20, 22 which are arranged at different distances from the respective printed circuit board pads 19 are essentially identical. In a preferred embodiment, the electrical properties of all the data connections 24 are identical. In the present preferred embodiment, the data connections 24 are formed in such a way that they are of the same length and have the same cross section. However, it would likewise be conceivable, for example, to form the data connections 24 with a different thickness and/or a different cross section and to adapt the length in such a way that the volume of connecting material present is identical in each case.

The preferred arrangement described above is achieved according to the invention by providing data connections 24 to data terminals 20, 22 which are arranged further away from the printed circuit board pads 19, that is to say data terminals 20, 22 of column III in the present case, with an almost minimal length which lies within the scope of the technical design possibilities. Whereas data connections 24 to data terminals 20, 22 which are arranged nearer to the printed circuit board pads 19, that is to say data terminals 20, 22 of column II in the present case, are provided such that they are longer than is actually necessary. In this case, e.g. an additional "curve" 60 is provided in order to lengthen the data connection in this way.

By virtue of this advantageous arrangement of the data connections 24, the impedances and capacitances of all the data connections 24 can be made to have the same magnitude or advantageously be matched, thereby enabling high-frequency operation of the semiconductor memory device 10. Furthermore, the provision of a common clock signal via the DQS terminals 22 minimizes the time skew or the temporal offset between the individual DQ terminals 20.

Moreover, voltage supply terminals VDDQ 26 are provided on the printed circuit board device 14 in order to supply the data terminals with a corresponding voltage. Grounding terminals VSSQ 28 corresponding thereto are likewise provided on the printed circuit board device 14. VDDQ 26 and VSSQ 28 are also referred to as data supply terminals 26, 28.

The data supply terminals 26, 28 are connected to corresponding printed circuit board pads 19 via data supply connections 30. In this case, at least two printed circuit board pads 19 are assigned to each data supply terminal 26, 27. In the present preferred embodiment, the data supply terminals 26, 28 are arranged between the data terminals 20, 22 and the printed circuit board pads 19, that is to say in column I in FIG. 3. A high current is required for the supply of the data terminals 20, 22. For this reason, the data supply terminals 26, 28 are connected to the corresponding printed circuit board pads 19 via so-called multiple bonds, i.e. relatively wide connections to a plurality of printed circuit board pads 19. By virtue of the advantageous arrangement of the data supply terminals 26, 28 between the data terminals 20, 22 and the printed circuit board pads 19, the data supply connections 30 can be made very short and, consequently, the supply inductance of the data supply connections 30 can be kept low.

The printed circuit board device 14 furthermore has supply terminals VSS 32 and VDD 34. Some of the supply terminals 32, 34 are designed as grounding terminals 32, some of the grounding terminals 32 being arranged in the outer region in column IV in the present case, of the printed circuit board device 14. Accordingly, the supply terminals 32, 34 are arranged in a column IV which, with regard to the columns II, III of the data terminals 20, 22, is arranged opposite to the printed circuit board pads 19. The supply terminals 32, 34 are connected to corresponding printed circuit board pads 19 via supply connections 36, 37. The supply connections 37 of the outer, i.e. arranged in column IV, grounding terminals 32 in each case run between two rows of the column-type arrangement of the data terminals 20, 22. In other words, in the present preferred embodiment, in each case two data terminals 20, 22 which are adjacent in the longitudinal direction in one of the columns II or III are separated before one another by a supply connections 37 running between them. Shielding of the data terminals 20, 22 can be achieved by virtue of this advantageous arrangement of the supply connections 36, said shielding serving to suppress interference.

The printed circuit board device 14 furthermore has addressing terminals A0–A18 38 for inputting address information and command terminals, e.g. CK, TCK, 42 for inputting commands. The addressing terminals 38 are connected via addressing connections 40 and the command terminals 42 are connected via command connections 44 to corresponding printed circuit board pads 19. The addressing terminals 38 and the command terminals 42 are preferably arranged on the printed circuit board device 14 in a manner grouped in one or more groups, for example in the group G2 in FIG. 3.

In order to electrically connect the printed circuit board device 14 to the memory chip 12, memory chip pads or bonding pads 50 are provided on the memory chip 12. Both the printed circuit board pads 19 and the memory chip pads 50 are preferably oriented in a column-like arrangement preferably in the longitudinal direction of the printed circuit board device 14, the printed circuit board pads 19 and the memory chip pads 50, which are intended to be connected to one another, in each case being essentially opposite one another, i.e. the arrangements of the printed circuit board pads 19 and memory chip pads 50 run essentially parallel to one another. In order to connect the printed circuit board device 14 to the memory chip 12, the printed circuit board pads 19 and the memory chip pads 15 are connected by means of a bonding wire or a connecting facility 16. The connecting facility 16 may preferably be designed as a gold wire. By virtue of the fact that the printed circuit board pads 19 and the memory chip pads 50 are directly opposite one another, the connection between the printed circuit board pads 19 and the memory chip pads 50, i.e. the connecting facility or the bonding wire 16, can be kept short, so that interfering influences brought about by the connecting facility 16 can be minimized.

In order to connect the memory chip 12 thus packaged to an external circuit (not shown) by means of the printed circuit board device 14, contact-making facilities or BGA balls 18 are provided on the printed circuit board device 14 at positions corresponding to the terminals 20, 22, 26, 28, 32, 34, 38, 42. The contact-making facilities 18 are electrically connected to the respective terminals and are preferably designed as small tin balls on the side of the printed circuit board device 14 which is not connected to the memory chip 12 or is opposite thereto. Such an arrangement of the contact-making facilities 18 is also called ball grid array (BGA).

The ratio of memory chip size to semiconductor device size can be configured advantageously by the provision of the printed circuit board device 14 according to the invention. In particular, the memory chip 12 can have essentially the same size as the printed circuit board device 14. The semiconductor device 10 can thus be formed as a so-called chip size package.

We claim:

1. In a semiconductor memory device, a printed circuit board for connecting a memory chip to an external circuit, the printed circuit board comprising:
    a multiplicity of pads for connecting the printed circuit board to the memory chip, the pads being arranged in at least one column;
    a multiplicity of data terminals arranged in at least two columns;
    data connections connecting the data terminals and the pads, the data connections being configured such that each data connection has essentially the same electrical properties as any other data connection;
    supply terminals for receiving supply voltages; and
    wherein the supply terminals comprise data supply terminals arranged in a grid between the data terminals and the pads, and wherein at least two pads are assigned to each data supply terminal.

2. The printed circuit board of claim 1, wherein the at least two columns in which the data terminals are arranged run parallel to the at least one column in which the pads are arranged.

3. The printed circuit board of claim 1, wherein the data connections are configured such that the temporal offset of a data signal traversing a data connection is essentially the same as the temporal offset of a data signal traversing any other data connection.

4. The printed circuit board of claim 1, wherein the physical length of each data connection is essentially the same as the physical length of any other data connection.

5. The printed circuit board of claim 1, wherein the cross-section of each data connection is essentially the same as the cross-section of any other data connection.

6. The printed circuit board of claim 1, further comprising a central region within which the pads are disposed.

7. The printed circuit board of claim 6, wherein the at least one column along which the pads are arranged is parallel to a longitudinal direction of the central region.

8. The printed circuit board of claim 1, further comprising:
    addressing terminals for receiving address information;
    addressing connections connecting the addressing terminals to pads assigned thereto;
    command terminals for receiving commands;
    command connections connecting the command terminals to pads assigned thereto; and
    supply connections connecting the supply terminals to pads assigned thereto.

9. The printed circuit board of claim 8, wherein the data terminals, command terminals, supply terminals, and addressing terminals are arranged in a grid.

10. The printed circuit board of claim 9, wherein the data terminals are arranged adjacent to one another within the grid, thereby defining a group within the grid.

11. The printed circuit board of claim 10, wherein the group comprises a two-dimensional array of data terminals.

12. The printed circuit board of claim 10, wherein the receiver strobe terminals are arranged along a longitudinal direction of a central region of the printed circuit board.

13. The printed circuit board of claim 8, wherein the supply terminals comprise grounding terminals arranged in a grid on an outer region of the printed circuit board.

14. The printed circuit board of claim 13, wherein the grid is on an outermost region of the printed circuit board.

15. The printed circuit board of claim 8, further comprising contact-making devices for connecting the printed circuit board to the external circuit, each contact-making device being disposed at a position corresponding to a terminal selected from the group consisting of addressing terminals, command terminals, data terminals, and supply terminals.

16. The printed circuit board of claim 15, wherein the contact-making devices comprise tin balls.

17. The printed circuit board of claim 1, wherein the data terminals comprise receiver strobe terminals.

18. The printed circuit board of claim 1, further comprising:
    a multiplicity of data supply terminals for connection of supply voltages for data transmission, the data supply terminals being arranged in a column, each data supply terminal being associated with at least two pads; and
    data supply connections connecting the data supply terminals and the pads.

19. The printed circuit board of claim 18, wherein the data supply terminals are arranged in a column that is essentially parallel to the at least one column along which the pads are arranged.

20. The printed circuit board of claim 18, wherein the pads and the data supply terminals are disposed directly opposite each other.

21. A chip-size package comprising a printed circuit board as recited in claim 1.

22. A semiconductor memory device comprising:
a memory chip having a plurality of memory-chip pads;
a printed circuit board for connecting the memory chip to an external circuit, the printed circuit board having:
- a multiplicity of printed-circuit-board pads for connecting the printed circuit board to the memory chip, the printed-circuit-board pads being arranged in at least one column and being configured to connect to corresponding memory-chip pads by a connection facility;
- a multiplicity of data terminals arranged in at least two columns; and
- data connections connecting the data terminals and the printed-circuit-board pads, the data connections being configured such that each data connection has essentially the same electrical properties as any other data connection;
- supply terminals for receiving supply voltages: and
- wherein the supply terminals comprise data supply terminals arranged in a and between the data terminals and the pads, and wherein at least two pads are assigned to each data supply terminal.

23. The semiconductor memory device of claim 22, wherein the memory chip pads are arranged in at least one column.

24. The semiconductor memory device of claim 22, wherein the memory-chip pads and their corresponding printed-circuit-board pads are opposite one another.

25. The semiconductor memory device of claim 22, wherein the printed circuit board and the memory chip are essentially the same size.

26. The semiconductor memory device of claim 22, wherein the memory chip comprises a DRAM.

27. A chip-size package comprising a printed circuit board as recited in claim 22.

28. In a semiconductor memory device, a printed circuit board for connecting a memory chip to an external circuit, the printed circuit board comprising:
- a multiplicity of pads for connecting the printed circuit board to the memory chip, the pads being arranged in at least one column;
- a multiplicity of data terminals arranged in at least two columns;
- data connections connecting the data terminals and the pads, the data connections of at least two data terminals arranged in different columns and configured such that at least on of the electrical properties and the temporal offset of the respective data signals are essentially equal;
- supply terminals for receiving supply voltages; and
- wherein the supply terminals comprise data supply terminals arranged in a grid between the data terminals and the pads, and wherein at least two pads are assigned to each data supply terminal.

* * * * *

UNITED STATES PATENT AND TRADEMARK OFFICE
CERTIFICATE OF CORRECTION

PATENT NO.    : 6,781,220 B2             Page 1 of 1
DATED         : August 24, 2004
INVENTOR(S)   : Andreas Täuber, Jean-Marc Dortu, Paul Schmölz and Robert Feurle It is certified that error appears in the above-identified patent and that said Letters Patent is hereby corrected as shown below:

Title page,
Item [12], Title, should read, "Täuber et al."
Item [75], Inventors, should read -- Andreas Täuber, Unterschleissheim --

Signed and Sealed this

Thirtieth Day of November, 2004

JON W. DUDAS
*Director of the United States Patent and Trademark Office*